United States Patent
Lo et al.

(10) Patent No.: US 10,739,673 B2
(45) Date of Patent: Aug. 11, 2020

(54) PREPARING PATTERNED NEUTRAL LAYERS AND STRUCTURES PREPARED USING THE SAME

(71) Applicant: Taiwan Semiconductor Manufacturing Company Limited, Hsinchu (TW)

(72) Inventors: Kuan-Hsin Lo, Nantou County (TW); Ching-Yu Chang, Yilang county (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 782 days.

(21) Appl. No.: 14/310,210

(22) Filed: Jun. 20, 2014

(65) Prior Publication Data
US 2015/0367379 A1    Dec. 24, 2015

(51) Int. Cl.
| B05D 3/06 | (2006.01) |
| B05D 1/32 | (2006.01) |
| B05D 1/38 | (2006.01) |
| B05D 3/00 | (2006.01) |
| B05D 5/00 | (2006.01) |
| G03F 7/00 | (2006.01) |

(52) U.S. Cl.
CPC ..... G03F 7/0002 (2013.01); *Y10T 428/24851* (2015.01)

(58) Field of Classification Search
CPC ....................................................... G03F 7/002
USPC ....................................................... 428/195.1
See application file for complete search history.

(56) References Cited

U.S. PATENT DOCUMENTS

| 4,728,591 A | 3/1988 | Clark et al. |
| 5,215,867 A * | 6/1993 | Stillwagon ............... G03F 7/36 216/47 |
| 6,746,825 B2 | 6/2004 | Nealey et al. |
| 7,189,435 B2 | 3/2007 | Tuominen et al. |
| 7,459,400 B2 | 12/2008 | Arias et al. |
| 7,521,094 B1 | 4/2009 | Cheng et al. |
| 8,163,189 B2 | 4/2012 | Iyoda et al. |
| 8,206,601 B2 | 6/2012 | Bosworth et al. |
| 8,226,838 B2 | 7/2012 | Cheng et al. |
| 8,247,033 B2 | 8/2012 | Russell et al. |
| 8,309,278 B2 | 11/2012 | Yang et al. |
| 8,398,868 B2 | 3/2013 | Cheng et al. |
| 2003/0015494 A1 | 1/2003 | Jayashankar et al. |

(Continued)

OTHER PUBLICATIONS

Cheng, Joy, Ross, Caroline, Smith, Henry, Thomas, Edwin; Templated Self-Assembly of Block Copolymers: Top-Down Helps Bottom-Up; Advanced Materials, 18; pp. 2505-2521; 2006.

Jung, Yeon Sik, Lee, Ju Ho, Lee, Jeong Yong, Ross, C.A.; Fabrication of Diverse Metallic Nanowire Arrays Based on Block Copolymer Self-Assembly; Nano Letters, 10(9); pp. 3722-3726; 2010.

(Continued)

*Primary Examiner* — Ian A Rummel
(74) *Attorney, Agent, or Firm* — Jones Day

(57) ABSTRACT

Embodiments provided herein provide methods for preparing patterned neutral layers using photolithography, and structures prepared using the same. A method of preparing a structure may include disposing a film over a surface of a substrate, and removing plurality of elongated trenches from the film so as to define a plurality of spaced lines. A neutral layer may be disposed over the outer surface of each line, and may include a neutral group attached to the outer surface of that line via a covalent bond or a hydrogen bond. The surface of the substrate between the lines may be substantially free of the neutral layer.

18 Claims, 9 Drawing Sheets

(56) References Cited

U.S. PATENT DOCUMENTS

| | | | |
|---|---|---|---|
| 2003/0064327 A1* | 4/2003 | Rottstegge | G03F 7/0382 |
| | | | 430/325 |
| 2008/0176767 A1* | 7/2008 | Millward | B81C 1/00031 |
| | | | 506/20 |
| 2008/0311347 A1* | 12/2008 | Millward | B81C 1/00031 |
| | | | 428/144 |
| 2009/0179001 A1 | 7/2009 | Cheng et al. | |
| 2009/0274887 A1* | 11/2009 | Millward | B81C 1/00031 |
| | | | 428/221 |
| 2012/0276346 A1 | 11/2012 | Russell et al. | |
| 2012/0301677 A1 | 11/2012 | Russell et al. | |
| 2012/0331428 A1 | 12/2012 | Cheng et al. | |
| 2013/0005150 A1 | 1/2013 | Ogihara et al. | |

OTHER PUBLICATIONS

Somervell, Mark, Gronheid, Roel, Hooge, Joshua, Nafus, Kathleen, Rincon Delgadillo, Paulina, Thode, Chris, Younkin, Todd, Matsunaga, Koichi, Rathsack, Ben, Scheer, Steven, Nealey, Paul; Comparison of Directed Self-Assembly Integrations; Advances in Resist Materials and Processing Technology, 29; 2012.

Son, Jeong Gon, Hannon, Adam; Gotrik, Kevin, Alexander-Katz, Alfredo, Ross, Caroline; Hierarchical Nanostructures by Sequential Self-Assembly of Styrene-Dimethylsiloxane Block Copolymers of Different Periods; Advanced Materials, 23; pp. 634-639; 2011.

Takenaka, Mikihito, Aburaya, Shusuke, Akasaka, Satoshi, Hasegawa, Hirokazu, Hadjichristidis, Nikos, Sakellariou, George, Tada, Yasuhiko, Yoshida, Hiroshi; Formation of Long-Range Stripe Patterns with Sub-10-nm Half-Pitch from Directed Self-Assembly of Block Copolymer; Journal of Polymer Science: Part B: Polymer Physics, 48; pp. 2297-2301; 2010.

* cited by examiner

P100

NL coating + TMAH wash

CD=39nm

CD=53nm

PREPARING PATTERNED NEUTRAL LAYERS AND STRUCTURES PREPARED USING THE SAME

BACKGROUND

This application generally relates to preparing patterned layers using photolithography, and structures prepared using the same.

The electronics industry has spent a significant amount of time and effort to reduce the lateral dimensions of patterned materials in electronic devices. For example, photolithography is a widely known technique in which light is used to pattern a photoresist, that then is used to pattern another material, such as to define lines, trenches, holes, or more complex patterns. In photolithography, the lateral dimensions of the pattern defined in the photoresist may be the same as the lateral dimensions of the other material. The electronics industry continues to research techniques for reducing the size of lateral features within photolithographically defined patterns.

It would be desirable to define patterns having smaller lateral dimensions than are presently achievable using photolithography. Such patterns may be referred to as "sub-lithographic." One exemplary method for achieving sub-lithographic patterns in materials utilizes directed self-assembly (DSA) of block copolymers, which also may be referred to as guided self-assembly or templated self-assembly. DSA has the potential to extend scaling for lines, trenches, and holes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
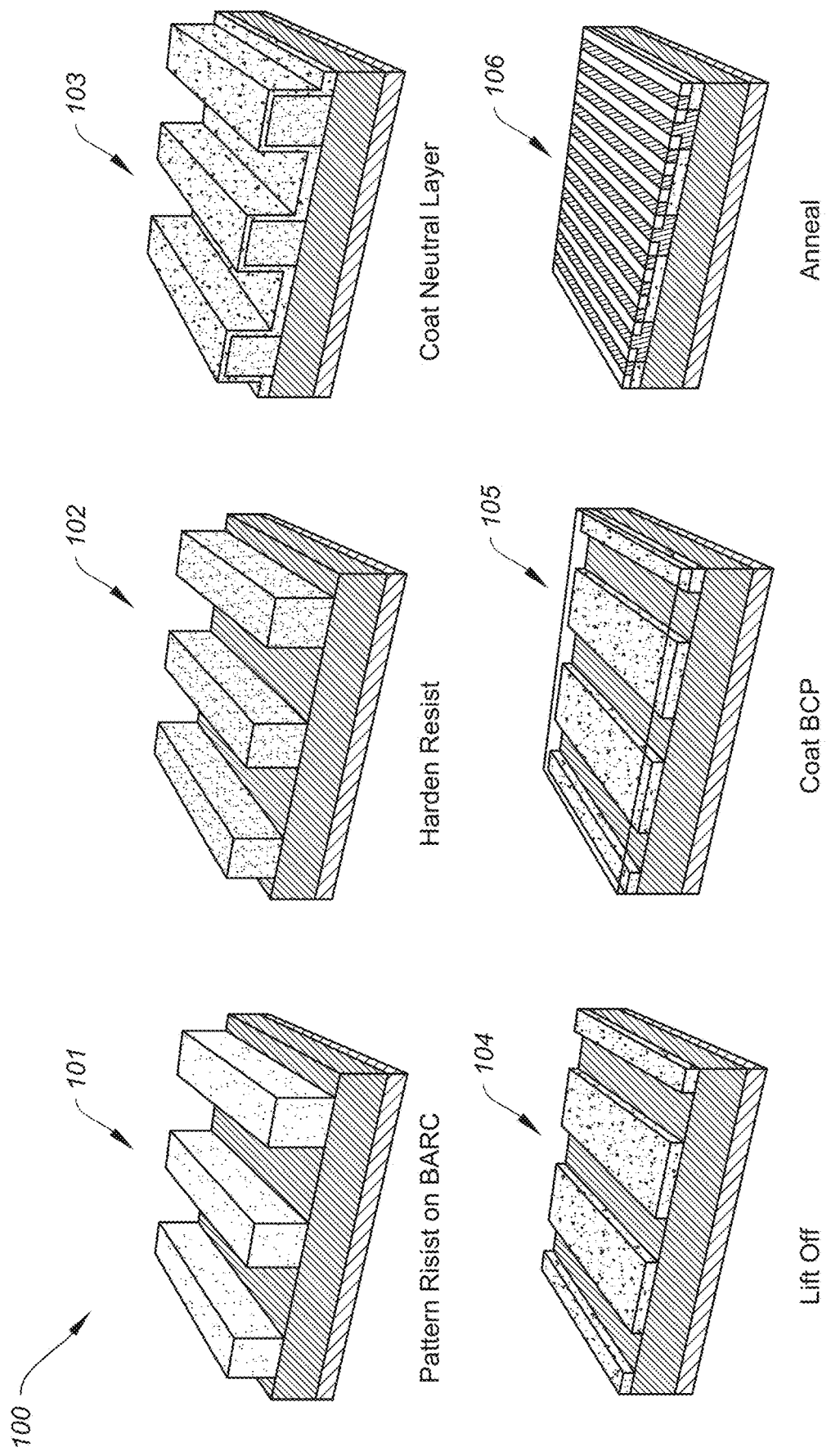
FIGS. 1A and 1B illustrate other approaches for preparing structures that include patterned neutral layers having self-assembled block copolymers disposed thereon.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provided herein provide methods for preparing patterned neutral layers using photolithography, and structures prepared using the same. As used herein, a "neutral layer" also may be referred to as an "orientation control layer," and can have a composition that is selected to provide a surface tension that is approximately the same as a surface tension of a first block of a block copolymer that may be disposed thereon, e.g., has a "neutral" surface tension relative to that block. Accordingly, the block copolymer may minimize its free energy by preferentially orienting the blocks such that the first block is disposed over, and in contact with, the neutral layer.

Embodiments provided herein provide methods for preparing patterned neutral layers in which the neutral layers may be selectively disposed over the outer surfaces of lines that are defined over the surface of a substrate, in such a manner that the surface of the substrate between the lines may be substantially free of the neutral layer. For example, a film may be disposed over the surface of the substrate. A plurality of elongated trenches may be removed from the film so as to define a plurality of spaced lines disposed over the surface of the substrate. Each line has an outer surface, upon which a neutral layer then is disposed. The neutral layer may include a neutral group attached to the outer surface of the line via a covalent bond or a hydrogen bond. The surface of the substrate can be substantially free of the neutral layer. In some embodiments, the lines are defined using a photoresist, such as a negative photoresist or a positive photoresist, e.g., by irradiating elongated portions of the photoresist through a bright mask and then dissolving non-irradiated portions of the photoresist. The irradiated portions define the lines, and the dissolved non-irradiated portions define the trenches. The neutral layer may be disposed over the outer surface of each line by applying to that line a precursor that includes the neutral group and a reactive group covalently bound to the neutral group, and reacting the reactive group of the applied precursor with the outer surface of the line so as to form the covalent bond or the hydrogen bond. In comparison, the other approaches such as illustrated in FIGS. 1A-1B may dispose the neutral layer over the surface of the substrate using a greater number and complexity of processing steps that also may reduce the quality and reproducibility of the pattern of the neutral layer, e.g., by patterning the neutral layer using lift-off of patterned photoresist.

FIG. 1A illustrates an exemplary scheme 100 for patterning lines within a block copolymer using DSA. Step 101 of scheme 100 includes patterning a positive photoresist on a bottom anti-reflective coating (BARC) disposed on a substrate. More specifically, portions of the photoresist are irradiated with light and subsequently removed using a developer so as to form trenches, thus defining the lines illustrated at step 101 of FIG. 1A. The patterned photoresist then is hardened at step 102. At step 103, a neutral layer is deposited over the patterned photoresist and the BARC, and at step 104 the patterned photoresist then is removed ("lift off") so as to leave behind a patterned neutral layer. A block copolymer (BCP) is coated over the patterned neutral layer at step 105, and then annealed at step 106 which causes one block of the BCP to become pinned to the neutral layer. The copolymer blocks of the BCP are selected such that, when one block becomes pinned to the neutral layer, the blocks self-assemble into lines having a pitch that is a multiple of the pitch of the pattern within the neutral layer.

Figure 1B:
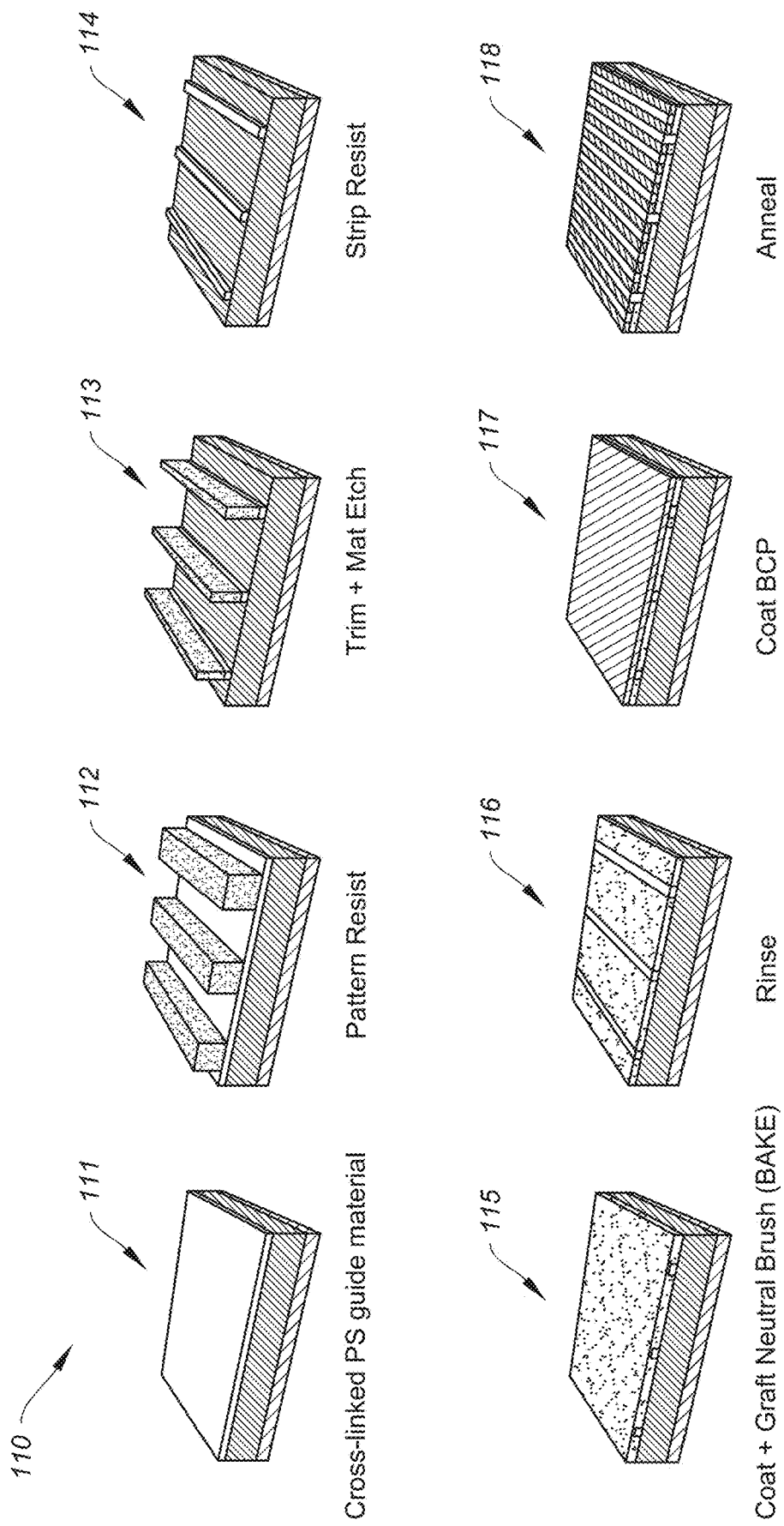

FIG. 1B illustrates an alternative scheme 110 for patterning lines within a block copolymer using DSA. Step 111 of scheme 100 includes disposing a cross-linked polystyrene (PS) guide material as a substrate, and then patterning a positive photoresist on the PS material. More specifically, portions of the photoresist are irradiated with light and subsequently removed using a developer so as to form trenches, thus defining the lines illustrated at step 112 of FIG. 1A. The patterned photoresist then is trim etched at step 113 to form narrower lines. At step 114, the narrowed lines of photoresist are used as a mask to pattern the PS material, and subsequently stripped. At step 115, the patterned PS material is coated, a neutral brush is grafted thereto, and the assembly is baked and subsequently rinsed at step 116 so as to leave behind a patterned neutral layer. A BCP then is coated over the patterned neutral layer at step 117, and then annealed at step 118 which causes one block of the BCP to become pinned to the neutral layer and causes the blocks to self-assemble into lines having a pitch that is a multiple of the pitch of the pattern within the neutral layer. For further details about schemes such as illustrated in FIGS. 1A-1B, see Somervell et al., Proc. of SPIE Vol. 8325, 83250G-1 to 83250G-14, the entire contents of which are incorporated by reference herein.

First, exemplary structures that may be formed using the present methods will be described. Then, exemplary methods that may be used to form such structures will be described in greater detail. Lastly, some exemplary structures that were formed using the present methods will be described.

Figure 2A:
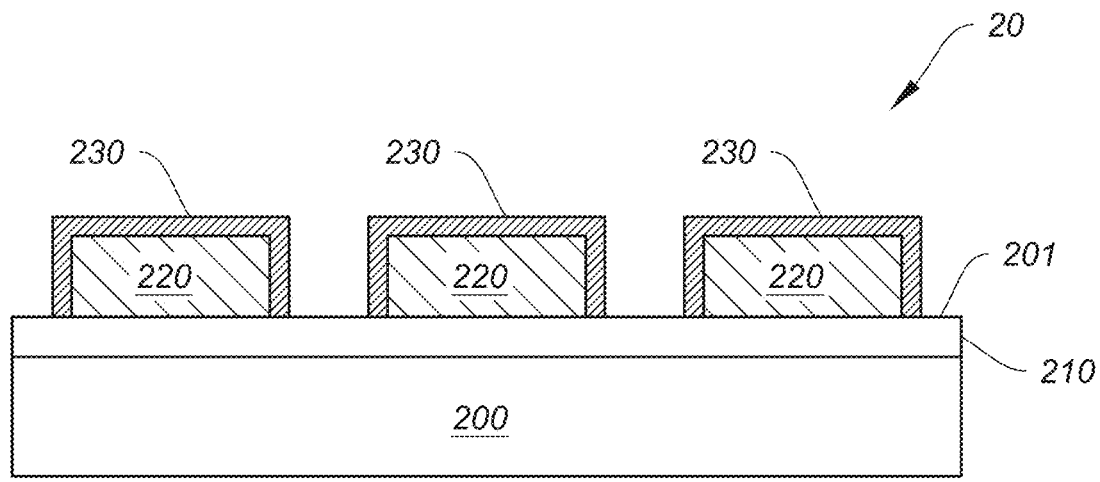
FIGS. 2A and 2B respectively illustrate cross-sectional and plan views of structures that include patterned neutral layers, in accordance with some embodiments.
Figure 2B:
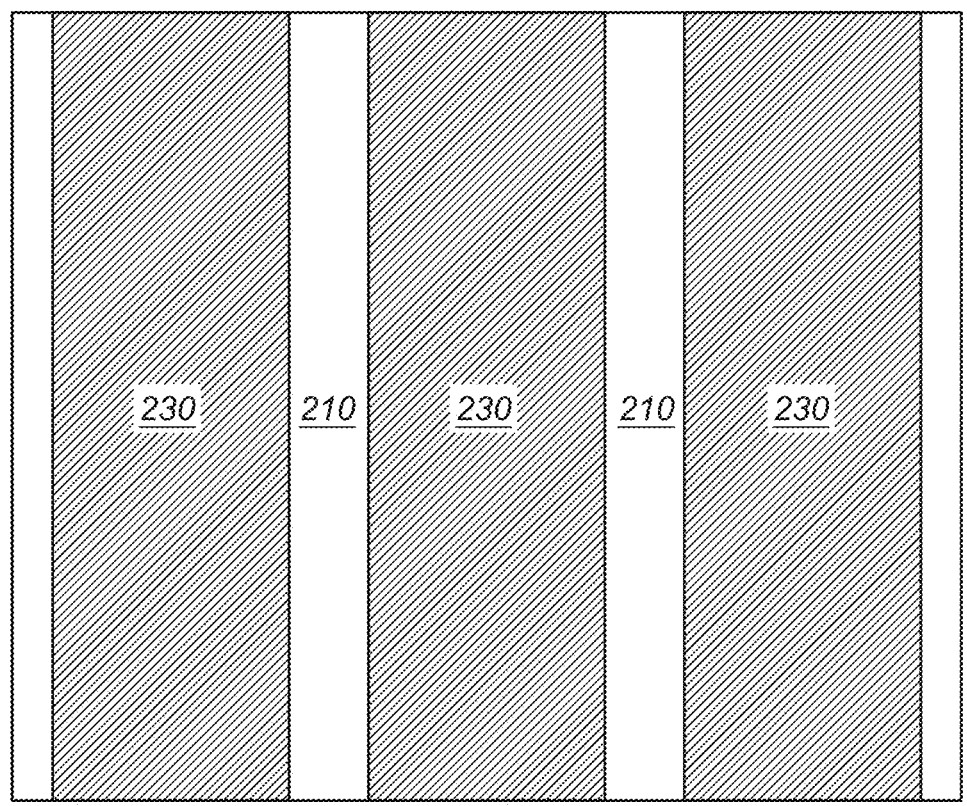

FIGS. 2A and 2B respectively illustrate cross-sectional and plan views of structures that include patterned neutral layers, in accordance with some embodiments. As perhaps best seen in FIG. 2A, structure 20 includes substrate 200 having a surface 201 that includes optional non-reactive layer 210, a plurality of spaced lines 220 disposed over surface 210 of the substrate, and a neutral layer 230 disposed over the outer surface of each line. Surface 201 of substrate 200 can be substantially free of the neutral layer, such that the neutral layer 230 can be located substantially only upon the outer surfaces of lines 200. In one example, neutral layer 230 includes a neutral group attached to the outer surface of that line via a covalent bond or a hydrogen bond, as described in greater detail below.

Substrate 200 may include any suitable material or combination of materials known in the art. For example, substrate 200 may include one or more of a semiconductor material, a conductive material, or an insulative material. Non-limiting examples of suitable semiconductor materials suitable for use in substrate 200 include silicon (Si), germanium (Ge), gallium phosphide (GaP), gallium nitride (GaN), gallium arsenide (GaAs), indium phosphide (InP), and silicon carbide (SiC). In one illustrative embodiment, substrate 200 includes an Si wafer. Nonlimiting examples of suitable conductive materials suitable for use in substrate 200 include metals such as copper, aluminum, platinum, gold, or silver. Nonlimiting examples of suitable insulative materials suitable for use in substrate 200 include sapphire, glasses such as silicon oxide ($SiO_x$), polymers such as polystyrene, aerogels, and silicon nitride (SiN).

Substrate 200 may, for example, include a wafer, e.g., a single-crystal wafer, or may include a film disposed over a solid support such as glass or sapphire. The substrate may be monocrystalline, and optionally may have a particular crystalline orientation. For example, Si substrates are available in various crystallographic orientations, such as [100] or [111], either of which may be suitable. Alternatively, the substrate may include a polycrystalline or amorphous material.

Substrate 200 may also have structures defined therein, such as conductive lines, insulator layers, doped semiconductor regions, and the like. For example, in the embodiment illustrated in FIGS. 2A-2B, the upper surface 201 of substrate 200 includes optional non-reactive layer 210. By "non-reactive" it is meant that layer 210 is selected so as to inhibit the formation of covalent bonds or hydrogen bonds with the reactive group of the precursor used to form neutral layer 230, and thus to inhibit the formation of neutral layer 230 upon the upper surface 201 of substrate 200. For example, layer 210 may include a layer of material that is deposited onto substrate 200 so as to define the upper surface 201 of substrate 200. As one example, layer 210 may include a bottom anti-reflective coating (BARC) such as known in the art. Alternatively, the upper surface 201 of substrate 200 may be physically or chemically modified so as to form layer 210 that inhibits reactions between the material of which substrate 200 is formed and the reactive group of the precursor used to form neutral layer. Such arrangements may be described as a non-reactive layer disposed over a bulk material. In one illustrative example, a floating additive with carbon backbone structure, e.g., a fluoro-containing polymer, may be applied to substrate 200 or to layer 210 disposed thereon. The floating additive can "float" to the upper surface of substrate 200 or layer 210 and can inhibit formation of the neutral layer at that surface. In another illustrative example, if substrate 200 includes silicon, layer 210 may not include silicon. However, it should be noted that non-reactive layer 210 is purely optional. Indeed, numerous materials suitable for use in substrate 200 need not be further treated or have any non-reactive layer disposed upon so as to be non-reactive with the reactive group of the precursor used to form neutral layer 230.

As perhaps best seen in FIG. 2A, a plurality of spaced lines 220 are disposed over the upper surface 201 of substrate 200. Lines 220 can be spaced relative to one another so as to have a suitable pitch, for example, a pitch of between about 10 and about 1000 nm, e.g., a pitch of between about 10 nm and about 100 nm, e.g., a pitch of between about 20 and about 500 nm, e.g., a pitch of between about 50 and about 250 nm, e.g., a pitch of between about 75 nm and about 150 nm. In some embodiments, lines 220 can have a width between about 10 nm and about 200 nm, e.g., a width of between about 20 nm and about 100 nm, e.g., a width of between about 20 nm and about 80 nm, e.g., a width of between about 30 nm and about 70 nm. In one illustrative example, the width of lines 220 is approximately equal to the minimum feature size achievable by the photolithographic node being used to form lines 220, e.g., as described below with reference to FIG. 4A. Lines 220 further may have any suitable thickness, e.g., may have a thickness of about 10 nm to about 1000 nm, e.g., about 20 nm to about 500 nm, e.g., about 50 nm to about 250 nm. Additionally, note that although lines 220 are illustrated in FIG. 2A as having a generally rectangular cross-section, lines 220 may have any suitably shaped cross-section. For example, lines 220 may have curved cross-sections, square cross-sections, triangular cross-sections, or saw-tooth cross sections, and the like. For example, in the illustrative Examples provided further below with reference to FIGS. 6A-6D and 7A-7D, lines 220 may have a curved cross-section.

Spaced lines 220 may include any suitable material or combination of materials known in the art. In some embodiments, spaced lines 220 include a photoresist. For example, as described in greater detail below with reference to FIG. 4A, spaced lines 220 may be defined by disposing a photoresist over the surface 201 of substrate 200, and then removing a plurality of elongated trenches from the photoresist. In one illustrative embodiment, the photoresist is a negative photoresist. In another illustrative embodiment, the photoresist is a positive photoresist. The width and pitch of the trenches removed from the photoresist defines the width and pitch of lines 220. Without wishing to be bound by any theory, it is believed that the increased strength resulting from cross-linking lines 220 of a photoresist prior to removing trenches from other, non-cross-linked portions of the photoresist may improve the quality and durability of lines 220, such that lines 220 suitably may be subjected to further processing such as the deposition of neutral layer 230 thereon without significant degradation. For some nonlimiting examples of suitable photoresists and methods of patterning the same, see U.S. Patent Publication No. 2013/0005150 to Ogihara et al., the entire contents of which are incorporated by reference herein.

It should be noted that although use of a photoresist may be included in some circumstances, any suitable material or combination of materials may be used to define lines 220. For example, spaced lines 220 may include one or more of a semiconductor material, a conductive material, or an insulative material. Non-limiting examples of suitable semiconductor materials suitable for use in substrate 200 include silicon (Si), germanium (Ge), gallium phosphide (GaP), gallium nitride (GaN), gallium arsenide (GaAs), indium phosphide (InP), and silicon carbide (SiC). Nonlimiting examples of suitable conductive materials suitable for use in spaced lines 220 include metals such as copper, aluminum, platinum, gold, or silver. Nonlimiting examples of suitable insulative materials suitable for use in spaced lines 220 include sapphire, glasses such as silicon oxide ($SiO_x$), polymers such as polystyrene, aerogels, and silicon nitride (SiN).

As shown in FIGS. 2A-2B, a neutral layer 230 is disposed over the outer surface of each line 220. In some embodiments, the neutral layer is substantially continuous over the entire outer surface of each line 220. As described in greater detail below with reference to FIGS. 4A-4C, neutral layer 230 for each line can include a neutral group that is attached to the outer surface of that line via a covalent bond or a hydrogen bond. Exemplary covalent bonds suitably that may be used include ester bonds, amide bonds, and sulfonamide bonds. Additionally, the covalent bond between the neutral group and the outer surface of line 220 may include a cross-linker, wherein the neutral group is covalently bonded to the cross-linker, and the cross-linker is covalently bonded to the outer surface of line 220. Exemplary hydrogen bonds suitably that may be used include halide bonds, methyl trihalide bonds, and amine bonds.

Neutral layer 230 may include any suitable composition known in the art, or yet to be developed, that that is selected to provide a surface tension that is approximately the same as a surface tension of a first block of a block copolymer that may be disposed thereon, e.g., has a "neutral" surface tension relative to that block. Accordingly, the block copolymer may minimize its free energy by preferentially orienting the blocks such that the first block is disposed over, and in contact with, the neutral layer. Particular neutral layers, sometimes referred to as "orientation control layers," for use in preferentially orienting a particular block of a particular block copolymer, are known. It is believed that any such neutral layers or orientation control layers suitably may be adapted for use with certain embodiments provided herein.

In one nonlimiting example, U.S. Patent Publication No. 2009/0179001 to Cheng et al., the entire contents of which are incorporated by reference herein, discloses the use of epoxy-containing cycloaliphatic acrylic polymers as orientation control layers for block copolymer thin films, e.g., poly(styrene-b-methyl methacrylate) (PS-b-PMMA) diblock copolymers, as well as poly(styrene-b-vinyl pyridine), poly(styrene-b-butadiene), poly(styrene-b-isoprene), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), or a combination comprising at least one of the foregoing block copolymers. Or, in another nonlimiting example, Jung et al., "Fabrication of Diverse Metallic Nanowire Arrays Based on Block Copolymer Self-Assembly," Nano Lett. 10(9): 3722-3726 (2010), the entire contents of which are incorporated by reference herein, discloses the use of a polydimethylsiloxane (PDMS) brush layer as an orientation control layer for a poly(styrene-b-dimethylsiloxane) (PS-PDMS) diblock copolymer thin film.

Additionally, it should be appreciated that lines 220 may have any suitable shape and geometry in the lateral dimension, and need not necessarily be elongated or parallel to one another as is illustrated in FIGS. 2A-2B. For example, lines 220 suitably may be curved in the lateral dimension, or may include discrete islands, e.g., round or polygonal islands, such as square islands, or may include a layer having apertures defined therein, e.g., round or polygonal apertures, such as square apertures.

Figure 3A:
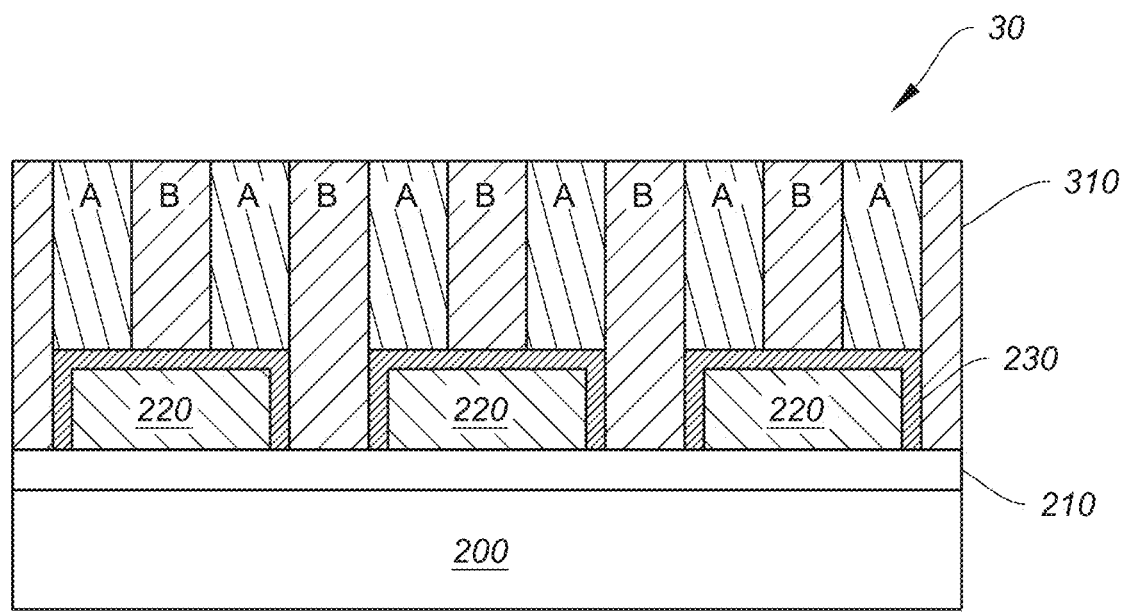
FIGS. 3A and 3B respectively illustrate cross-sectional and plan views of structures that include patterned neutral layers having self-assembled block copolymers disposed thereon, in accordance with some embodiments.
Figure 3B:
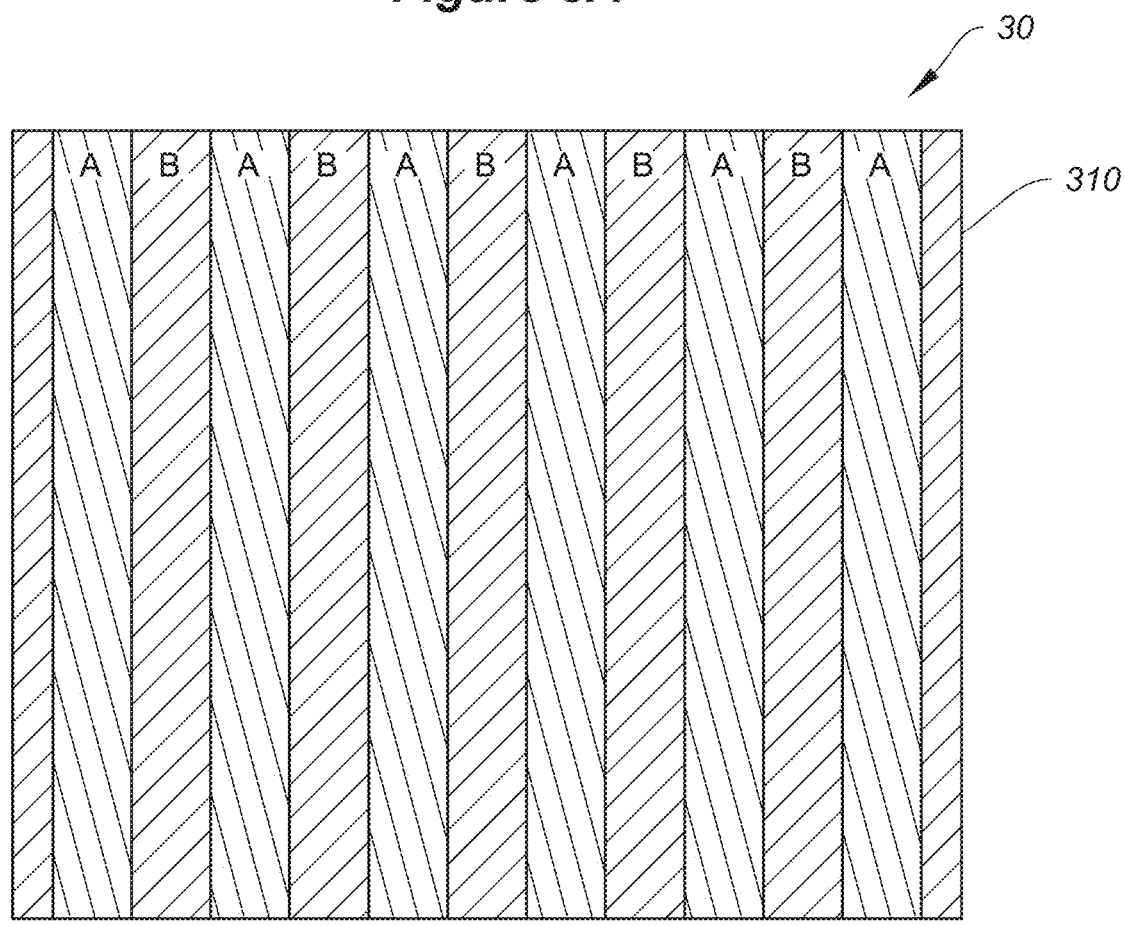

FIGS. 3A and 3B respectively illustrate cross-sectional and plan views of structure 30 that includes patterned neutral layers having self-assembled block copolymers disposed thereon, in accordance with some embodiments. As perhaps best seen in FIG. 3A, structure 30 includes substrate 200 having a surface 201 that includes optional non-reactive layer 210, a plurality of spaced lines 220 disposed over surface 201 of the substrate, a neutral layer 230 disposed over the outer surface of each line, and a block copolymer 310 disposed over the neutral layer 230 over the outer surface of each line 220 as well as over surface 201 of the substrate. Substrate 201, optional layer 210, lines 220, and neutral layer 230 may be substantially as described above with reference to FIGS. 2A-2B. One or more blocks of block copolymer 310 may be disposed over surface 201 of substrate 200, while one or more blocks of block copolymer 310 may be disposed over neutral layer 230. In some embodiments, neutral layer 230 pins at least one block of the block copolymer. For example, in the embodiment illustrated in FIGS. 3A-3B, block copolymer 310 includes an "A-B" type di-block copolymer, in which the "A" block is pinned to neutral layer 230, and the block "B" is disposed between the "A" blocks. Note that the spatial frequency (inverse of pitch) of the "A" blocks within copolymer 310 can be an integer multiple of the spatial frequency of lines 220. For example, in the exemplary embodiment illustrated in FIGS. 3A-3B, the spatial frequency of the "A" blocks is approximately twice the spatial frequency of lines 220. Accordingly, because lines 220 are defined lithographically, the pattern of block copolymer 310 may be considered to be sublithographic. Note that any suitable type of block copolymer may be used, including diblock copolymers, triblock copolymers, and so on. Block copolymers, and suitable neutral groups for causing preferential orientation of one or more blocks of such block copolymers, are known in the art.

Exemplary methods for preparing structures including patterned neutral layers now will be described with reference to FIGS. 4A-4C, and exemplary intermediate structures that may be formed using such methods also will be described with reference to FIGS. 5A-5F.

Figure 4A:
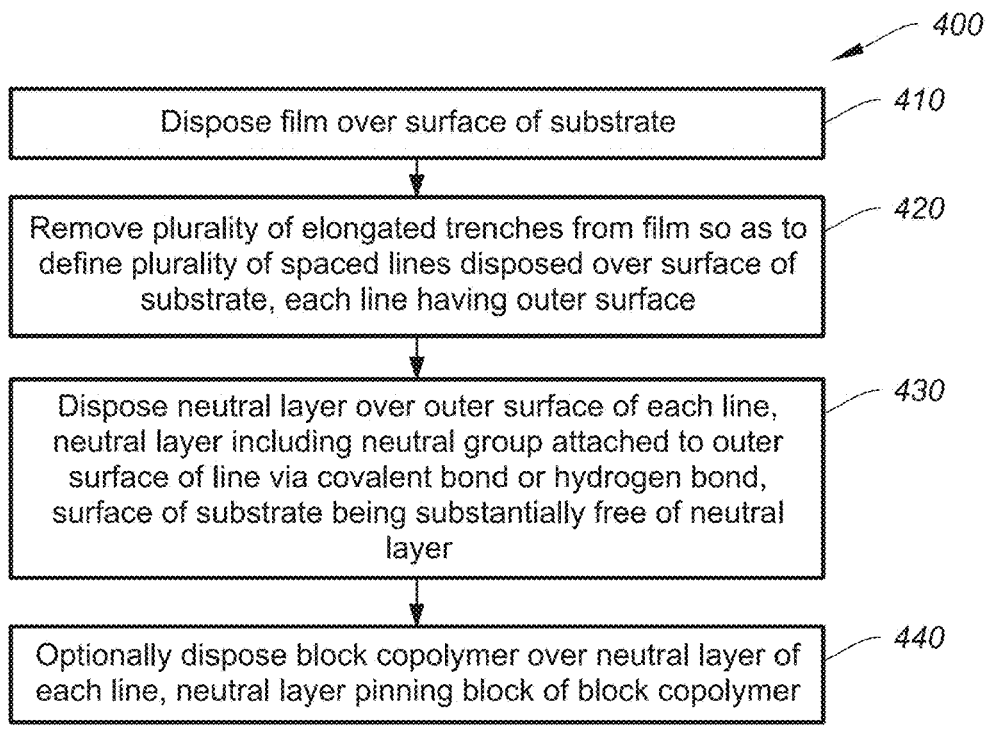
FIG. 4A illustrates steps in a method for preparing structures that include patterned neutral layers optionally having self-assembled block copolymers disposed thereon, in accordance with some embodiments.
Figure 5A:
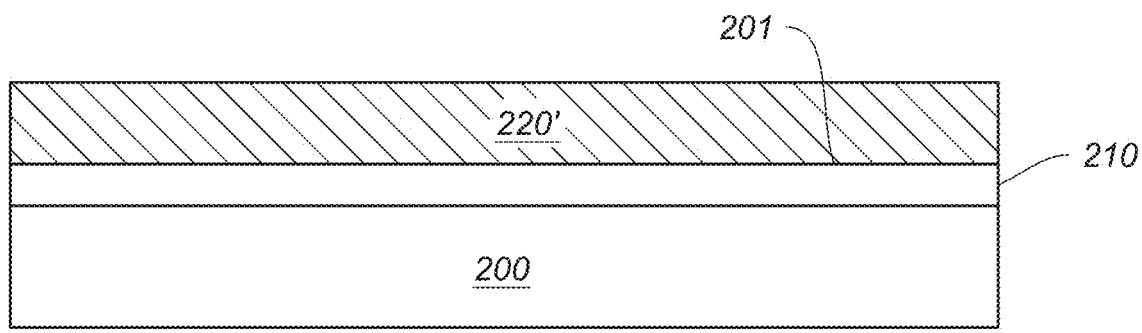
FIGS. 5A-5F illustrate intermediate structures that may be formed using the methods of FIGS. 4A-4C, in accordance with some embodiments.

FIG. 4A illustrates steps in a method 400 for preparing structures that include patterned neutral layers optionally having self-assembled block copolymers disposed thereon, in accordance with some embodiments. Method 400 includes disposing a film over the surface of a substrate (step 410). For example, as illustrated in FIG. 5A, film 220' may be disposed over surface 201 of substrate 200. As noted above with reference to FIGS. 2A-2B, substrate 200 optionally may include non-reactive film 210 disposed over a bulk material. Film 220' may include any suitable material, such as a photoresist, e.g., negative photoresist or positive photoresist.

Figure 5B:
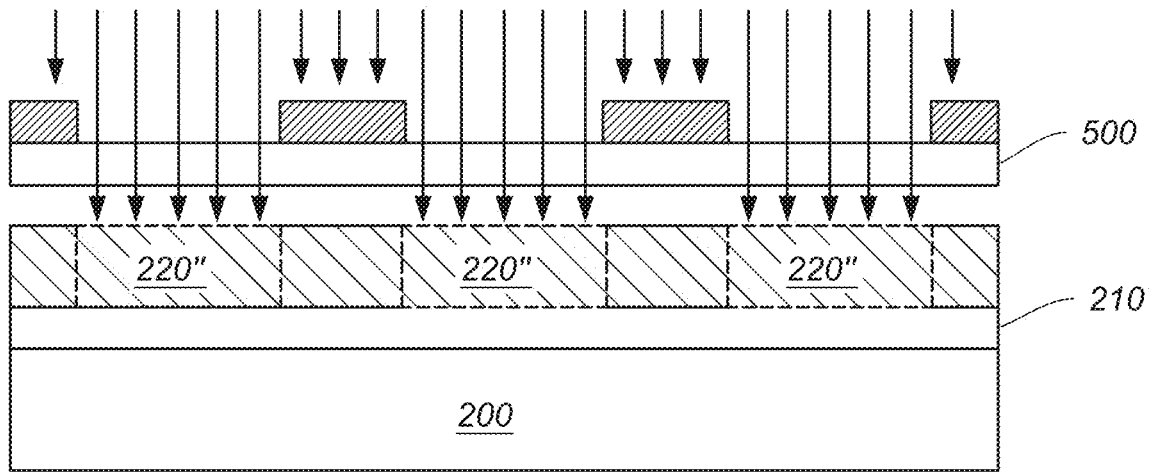
Figure 5C:
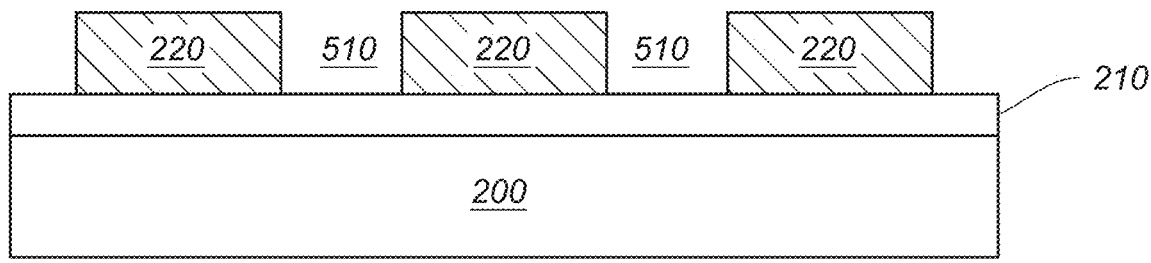

Method 400 illustrated in FIG. 4A continues with removing a plurality of elongated trenches from the film so as to define a plurality of spaced lines disposed over the surface of the substrate, each line having an outer surface (step 420). For example, FIG. 5B illustrates an embodiment in which film 220' includes a photoresist. The trenches may be removed by irradiating elongated portions 220" of film 220', e.g., through bright mask 500, and then dissolving non-irradiated portions of the film using photolithographic techniques well known in the art. The irradiated portions may define the lines, and the dissolved non-irradiated portions may define the trenches, e.g., lines 220 separated from one another by trenches 510 illustrated in FIG. 5C.

Method 400 illustrated in FIG. 4A continues with disposing a neutral layer over the outer surface of each line (step 430). The neutral layer can include a neutral group that is attached to the outer surface of the line via a covalent bond or a hydrogen bond, and the surface of the substrate is substantially free of the neutral layer, e.g., as described above with reference to FIGS. 2A-2B. Disposing the neutral layer over the line may, for example, include applying to the line a precursor that includes the neutral group and a reactive group covalently bound to the neutral group. The reactive group of the applied precursor may react with the outer surface of the line so as to form a covalent bond.

Figure 4B:
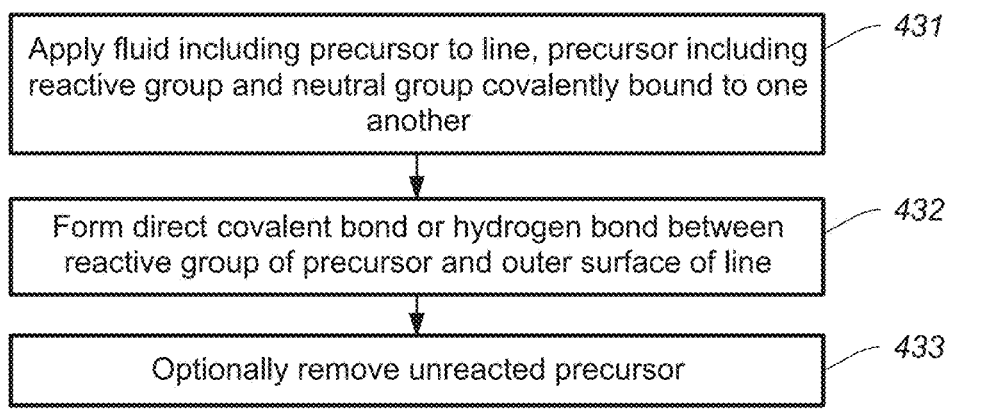
FIG. 4B illustrates steps in a method for covalently bonding a neutral layer to a line over the surface of a substrate, in accordance with some embodiments.
Figure 5D:
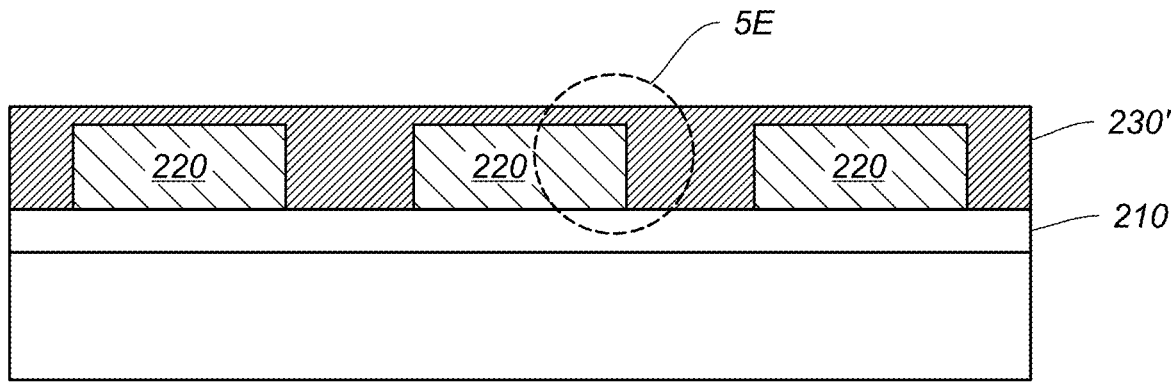

FIG. 4B illustrates steps in a method for covalently bonding a neutral layer to a line over the surface of a substrate, e.g., for executing step 430 of FIG. 4A, in accordance with some embodiments. FIG. 4B includes applying a fluid that includes the precursor to the line (step 431). For example, as illustrated in FIG. 5D, a fluid 230' that includes the precursor may be applied to at least the plurality of lines 220, and optionally also to the surface 201 of substrate 200. Suitable methods for applying fluids to substrates (and features thereon) are known in the art, and include, for example, spin-coating, spraying, dipping, and the like. As noted above, the precursor can include a reactive group and a neutral group covalently bound to one another.

Continuing with method 430 illustrated in FIG. 4B, the direct covalent bond or hydrogen bond may be formed between the reactive group of the precursor and the outer surface of the line (step 432). For example, in embodiments in which lines 220 include a photoresist, the outer surface of the lines may include carboxyl (COOH) groups, and the reactive group of the precursor may include a group that reacts with the carboxyl group of the line so as to form a covalent bond, such as a hydroxyl group (—OH) that forms an ester bond, an amine group (—$R_1R_2N$, in which $R_1$ and $R_2$ independently may be hydrogen or a carbon-containing group) that forms an amide bond, or a sulfonamide group (—$NH_2SO_2$) that forms a sulfonamide bond. Or, for example, the precursor may include a group that reacts with the carboxyl group of the line so as to form a hydrogen bond, such as a halide group (—X, where X is $F^-$ or $Cl^-$) that forms a halide bond, a methyl trihalide group (—$CX_3$, where X is F or CO that forms a trimethyl halide bond, or an amine group ($R_1R_2N$, in which $R_1$ and $R_2$ independently may be hydrogen or a carbon-containing group) that forms an amine bond. In one illustrative embodiment, the fluid is heated so as to facilitate formation of the covalent bond or the hydrogen bond.

Figure 5E:
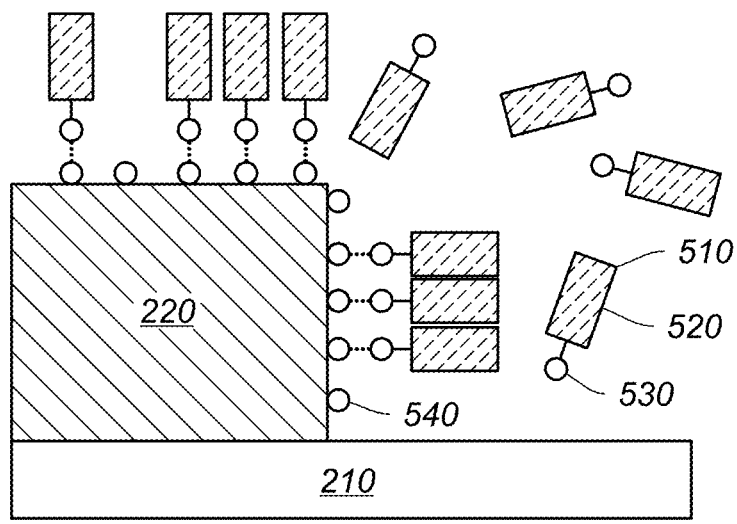

FIG. 5E schematically illustrates an exemplary manner in which a precursor may react with the outer surface of a line 220 in the inset portion of FIG. 5D denoted "5E." Each precursor molecule 510 may include neutral group 520 and reactive group 530 covalently bound to one another (bond indicated by short straight line). The outer surface of line 220 may include reactive sites 540. The reactive group 530 of precursor molecule 510 may react with reactive site 540, so as to form covalent bonds or hydrogen bonds (collectively indicated by dotted line) such as described above or known in the art, and disposing neutral groups 520 adjacent to the surface of line 220. In some embodiments, a sufficient amount of precursor molecules 510 are provided and react with reactive sites 540 such that neutral groups 520 substantially cover the entire outer surface of each line 220 and thus form a substantially continuous neutral layer over the entire outer surface of each line 220. In some embodiments, optional non-reactive layer 210 (or, absent non-reactive layer 210, the upper surface of substrate 200) lacks reactive sites 540, such that the reactive group 530 of precursor molecule 510 substantially does not react with layer 210 or the surface of substrate 200, and accordingly the surface of substrate 200 can remain substantially free of the neutral layer.

Note that although heating the applied fluid, such as in step 432 of FIG. 4B, may facilitate or reduce the time for forming a covalent bond or a hydrogen bond between each reactive group 530 and reactive site 540, that such heating may not necessarily be required, and should be considered optional. Additionally, as illustrated in FIG. 4B, after the reaction between the precursor and the outer surface of line 220, any unreacted precursor optionally may be removed (step 433).

Figure 4C:
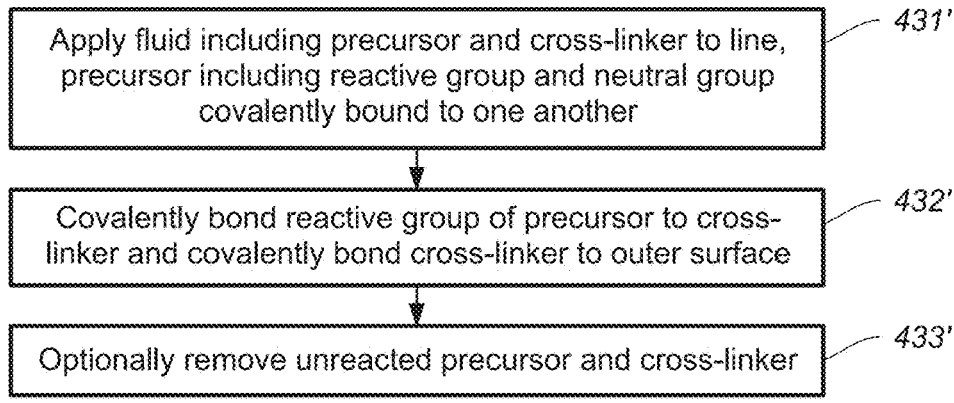
FIG. 4C illustrates steps in an alternative method for covalently bonding a neutral layer to a line over the surface of a substrate, in accordance with some embodiments.

FIG. 4C illustrates steps in an alternative method for covalently bonding a neutral layer to a line over the surface of a substrate, e.g., for executing an alternative 430' to step 430 of FIG. 4A, in accordance with some embodiments. FIG. 4C includes applying a fluid that includes the precursor and a cross-linker to the line (step 431'). For example, in a manner analogous to that illustrated in FIG. 5D, a fluid that includes the precursor and the cross-linker may be applied to at least the plurality of lines 220, and optionally also to the surface 201 of substrate 200. Suitable methods for applying fluids to substrates (and features thereon) are known in the art, and include, for example, spin-coating, spraying, dipping, and the like. As noted above, the precursor can include a reactive group and a neutral group covalently bound to one another.

Figure 5F:
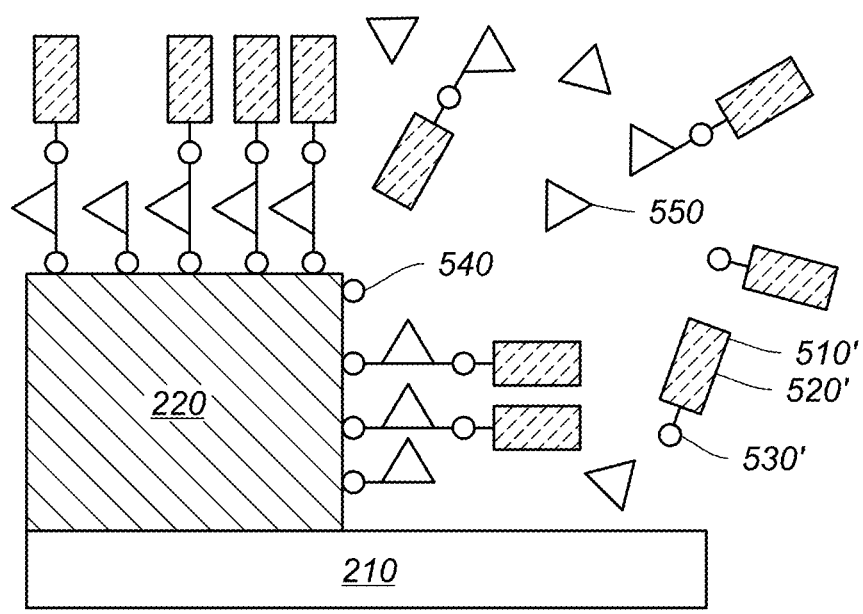

Continuing with alternative method 430' illustrated in FIG. 4C, the reactive group of the precursor may be covalently bonded to the cross-linker, and the cross-linker covalently bonded to the outer surface of the line (step 432'). FIG. 5F schematically illustrates the manner in which a precursor and cross-linker may react with one another and in which the cross-linker may react with the outer surface of a line 220 in a region analogous to that illustrated in the inset portion of FIG. 5D denoted "5E." Each precursor molecule 510' may include neutral group 520' and reactive group 530' covalently bound by one another (bond indicated by short straight line). The outer surface of line 220 may include reactive sites 540'. The reactive group 530' of precursor molecule 510 may react cross-linker 550, which in turn may react with reactive site 540', so as to form covalent bonds such as described above or known in the art, and disposing neutral groups 520' adjacent to the surface of line 220. In some embodiments, a sufficient amount of precursor molecules 510' and cross-linker 550 are provided and react with reactive sites 540' such that neutral groups 520' substantially cover the entire outer surface of each line 220' and thus form a substantially continuous neutral layer over the entire outer surface of each line 220. In some embodiments, optional non-reactive layer 210 (or, absent non-reactive layer 210, the upper surface of substrate 200) lacks reactive sites 540', such that cross-linker 550 substantially does not react with layer 210 or the surface of substrate 200, and accordingly the surface of substrate 200 can remain substantially free of the neutral layer and the cross-linker.

Note that the applied fluid optionally may be heated so as to facilitate or reduce the time for forming covalent bonds between each reactive group 530' and cross-linker 550 and between reactive site 540' and cross-linker 550. Additionally, as illustrated in FIG. 4C, after the reaction between the precursor and the outer surface of line 220, any unreacted precursor and cross-linker optionally may be removed (step 433').

Figure 6A:
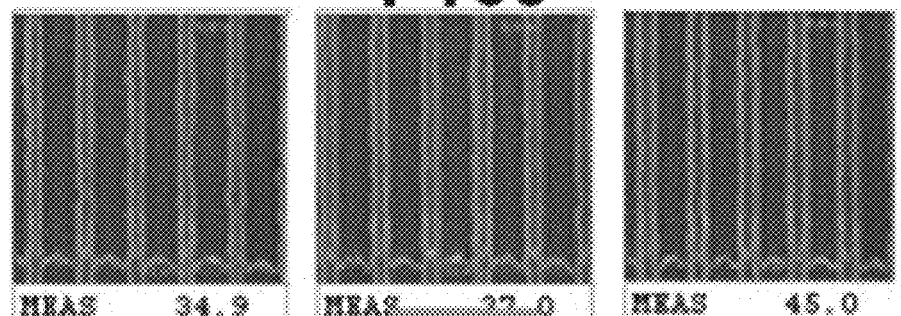
FIGS. 6A-6D and 7A-7D are micrograph images of samples prepared using the methods of FIGS. 4A-4C, in accordance with some embodiments.
Figure 6B:
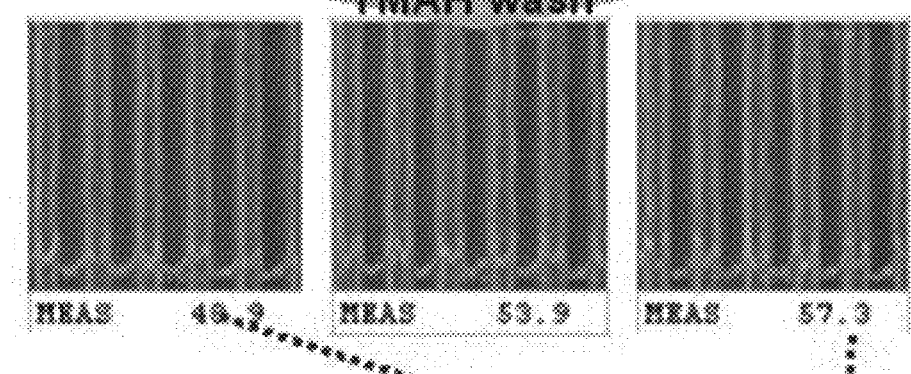
Figure 6C:
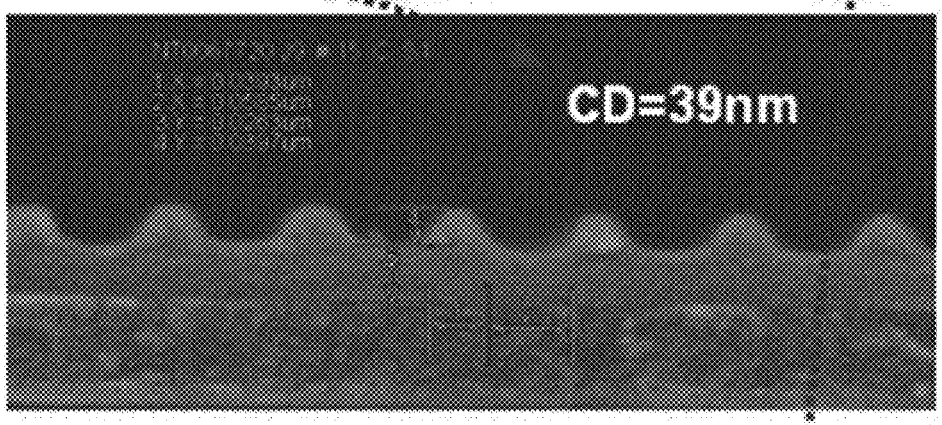
Figure 6D:
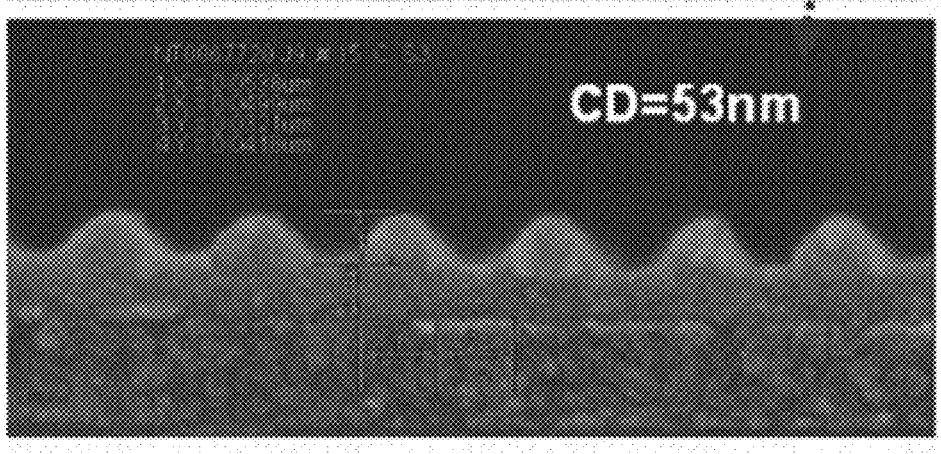
Figures 7A, 7B, 7C, 7D:
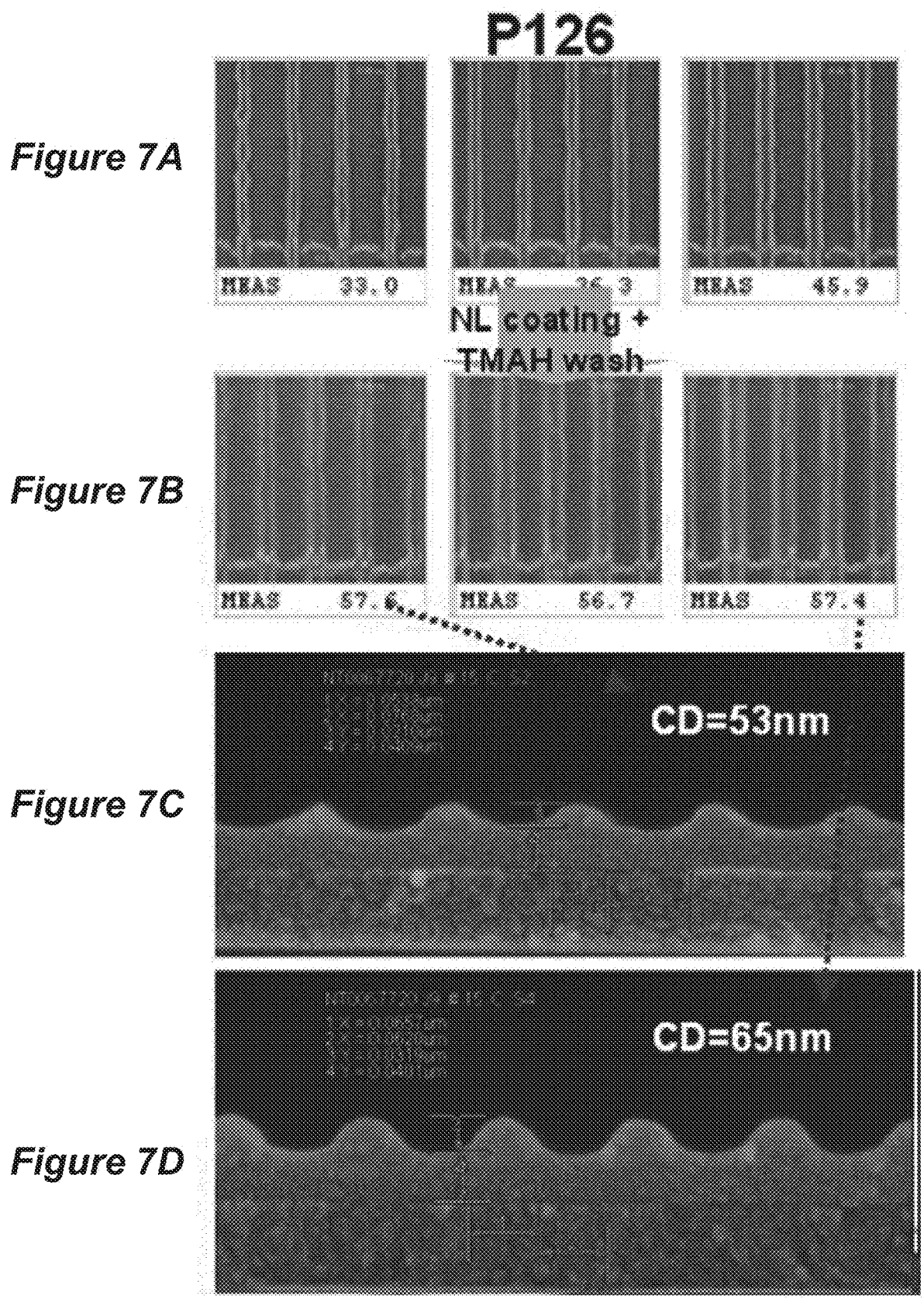

FIGS. 6A-6D and 7A-7D are micrograph images of samples prepared using the methods of FIGS. 4A-4C, in accordance with some embodiments. FIG. 6A illustrates photomicrographs of three samples that include lines of commercially available AIM8335 photoresist with crosslinker formed using deposition and photolithographic patterning, baking, and etching over a BARC disposed over a silicon substrate, in accordance with steps 410 and 420 illustrated in FIG. 4A. In FIG. 6A, the lines had a pitch (P) of 100 nm, and the average width of the lines in the three samples respectively were measured to be 34.9 nm, 37.0 nm, and 45.0 nm. FIG. 7A illustrates photomicrographs of three samples that were prepared analogously as for FIG. 6A, but for which the lines had a pitch (P) of 126 nm, and the average width of the lines in the three samples respectively were measured to be 33.0 nm, 36.3 nm, and 45.9 nm.

FIG. 6B illustrates photomicrographs of the three samples illustrated in FIG. 6A after depositing a neutral layer thereon in accordance with step 430 of FIG. 4A and steps 431' and 432' of FIG. 4C. Specifically, the neutral layer was a random copolymer of PS-PMMA having a hydroxyl (—OH) end-group that was covalently bound to carboxyl groups of the photoresist using a cross-linker, followed by a wash with tetramethyl ammonium hydroxide (TMAH). In FIG. 6B, the average width of the lines in the three samples respectively were measured to be 48.9 nm, 53.9 nm, and 57.3 nm. FIG. 7B illustrates photomicrographs of the three samples illustrated in FIG. 7A after depositing a neutral layer thereon in a manner analogous to that described above with reference to FIG. 6B. In FIG. 7B, the average width of the lines in the three samples respectively were measured to be 57.6 nm, 56.7 nm, and 57.4 nm. Accordingly, it may be understood that application of the neutral layer increased the average width of the lines for the P=100 nm samples by about 14 nm, 16.9 nm, and 12.3 nm, respectively, and for the P=126 nm samples by about 24.6 nm, 20.4 nm, and 11.5 nm, respectively.

FIG. 6C illustrates a photomicrograph of a cross-section of the sample of FIG. 6B having an average line width of 48.9 nm, in which it may be seen that a critical dimension (CD) of about 39 nm was measured, and in which the neutral layer-coated lines have a curved cross-section. FIG. 6D illustrates a photomicrograph of a cross-section of the sample of FIG. 6B having an average line width of 57.3 nm, in which it may be seen that a critical dimension (CD) of about 53 nm was measured, and in which the neutral layer-coated lines have a curved cross-section. FIG. 7C illustrates a photomicrograph of a cross-section of the sample of FIG. 7B having an average line width of 57.6, in which it may be seen that a critical dimension (CD) of about 53 nm was measured, and in which the neutral layer-coated lines have a curved cross-section. FIG. 7D illustrates a photomicrograph of a cross-section of the sample of FIG. 7B having an average line width of 57.4 nm, in which it may be seen that a critical dimension (CD) of about 65 nm was measured, and in which the neutral layer-coated lines have a curved cross-section.

Accordingly, it may be appreciated that the present structures and methods provide patterned neutral layers that are highly reproducible, made with relative ease, and that suitably may be used in subsequent processing, e.g., to preferentially orient a block within a block copolymer.

Accordingly, in one embodiment, a method of preparing a structure includes disposing a film over a surface of a substrate. A plurality of elongated trenches may be removed from the film so as to define a plurality of spaced lines disposed over the surface of the substrate. Each line has an outer surface. A neutral layer may be disposed over the outer surface of each line. The neutral layer may include a neutral group attached to the outer surface of that line via a covalent bond or a hydrogen bond. The surface of the substrate between the lines may be substantially free of the neutral layer.

In another embodiment, a structure includes a substrate having a surface, and a plurality of spaced lines disposed over the surface of the substrate, each line having an outer surface. The structure further includes a neutral layer disposed over the outer surface of each line. The neutral layer includes comprising a neutral group attached to the outer surface of that line via a covalent bond or a hydrogen bond. The surface of the substrate between the lines may be substantially free of the neutral layer.

In yet another embodiment, a structure includes a substrate having a surface, and a plurality of spaced lines disposed over the surface of the substrate, each line having an outer surface. The plurality of spaced lines are defined by removing a plurality of elongated trenches from a photoresist. The structure further includes a neutral layer disposed over the outer surface of each line. The neutral layer includes a neutral group attached to the outer surface of that line via a covalent bond or a hydrogen bond. The surface of the substrate between the lines may be substantially free of the neutral layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of preparing a structure, the method comprising:
    disposing a film over a surface of a substrate;
    removing a plurality of elongated trenches from the film so as to define a plurality of spaced lines comprising the film disposed over the surface of the substrate, each line having a cross-section above the substrate, the cross-section having an outer surface;
    disposing a surface tension neutral layer over the outer surface of each line, the surface tension neutral layer comprising a neutral group attached to the outer surface of that line via a covalent bond or a hydrogen bond, the surface of the substrate between the lines being substantially free of the surface tension neutral layer; and
    disposing a block copolymer over the neutral layer of each line and between the lines, the block copolymer having a first block and a second block, wherein the surface tension neutral layer has a first tension sufficiently similar to a second tension of the first block to pin the first block, wherein the block copolymer comprises at least one of poly(ethylene oxide-b-caprolactone), poly(methyl methacrylate-b-t-butyl methacrylate), poly(ethylene oxide-b-propylene oxide), poly(styrene-b-tetrahydrofuran), or poly(styrene-b-isoprene-b-ethylene oxide).

2. The method of claim 1, wherein disposing the surface tension neutral layer over the outer surface of each line comprises:
    applying a precursor to that line, the precursor comprising the neutral group and a reactive group covalently bound to the neutral group; and
    reacting the reactive group of the applied precursor with the outer surface of that line so as to form the covalent bond or the hydrogen bond.

3. The method of claim 2, wherein the outer surface of each line comprises a carboxyl (COOH) group, and wherein the reactive group of the precursor covalently reacts with the carboxyl group and substantially does not react with the surface of the substrate.

4. The method of claim 2, wherein the bond is covalent and the reactive group of the precursor is selected from the group consisting of: a hydroxyl group, an amine group, and a sulfonamide group, or wherein the bond is a hydrogen bond and the reactive group of the precursor is selected from the group consisting of: a halide group, a methyl trihalide group, and an amine group.

5. The method of claim 2, wherein applying the precursor to each line comprises applying a fluid comprising the precursor to at least the plurality of lines.

6. The method of claim 5, wherein forming the direct covalent bond or the hydrogen bond between the reactive group of the precursor and the outer surface comprises heating the applied fluid.

7. The method of claim 6, further comprising removing any unreacted precursor after covalently bonding the reactive group to the outer surface.

8. The method of claim 5, wherein the fluid further comprises a cross-linker, and wherein covalently bonding the reactive group of the precursor to the outer surface comprises covalently bonding the reactive group of the precursor to the cross-linker and covalently bonding the cross-linker to the outer surface.

9. The method of claim 1, wherein the surface tension neutral layer is substantially continuous over the entire outer surface of each line.

10. The method of claim 1, wherein the surface of the substrate comprises a non-reactive layer disposed over a bulk material.

11. The method of claim 1, wherein the film comprises photoresist, and wherein said removing comprises irradiating elongated portions of the film through a bright mask and then dissolving non-irradiated portions of the film, the irradiated portions defining the lines and the dissolved non-irradiated portions defining the trenches.

12. A method of preparing a structure, the method comprising:
    disposing a film over a surface of a substrate;
    defining a plurality of spaced lines comprising the film disposed on the surface of the substrate, each line having a cross-section above the substrate, the cross-section having an outer surface;
    disposing a surface tension neutral layer on the outer surface of each line, the surface tension neutral layer comprising a neutral group attached to the outer surface of that line via a covalent bond or a hydrogen bond, the surface of the substrate between the lines being substantially free of the surface tension neutral layer; and
    disposing a block copolymer over the neutral layer of each line and between the lines, the block copolymer having a first block and a second block, wherein the surface tension neutral layer has a first tension sufficiently similar to a second tension of the first block to pin the first block, wherein the block copolymer comprises at least one of poly(ethylene oxide-b-caprolactone), poly(methyl methacrylate-b-t-butyl methacrylate), poly(ethylene oxide-b-propylene oxide), poly(styrene-b-tetrahydrofuran), or poly(styrene-b-isoprene-b-ethylene oxide).

13. The method of claim 12, wherein the covalent bond is selected from the group consisting of: an ester bond, an amide bond, and a sulfonamide bond, or wherein the hydrogen bond is selected from the group consisting of: a halide bond, a methyl trihalide bond, and an amine bond.

14. The method of claim 12, wherein the covalent bond comprises a cross-linker and wherein the neutral group is covalently bonded to the cross-linker and the cross-linker is covalently bonded to the outer surface.

15. The method of claim 12, wherein the surface tension neutral layer is substantially continuous over the entire outer surface of each line.

16. The method of claim 12, wherein the surface of the substrate comprises a non-reactive layer disposed on a bulk material.

17. The method of claim 16, wherein the lines comprise a negative photoresist.

18. A method of preparing a structure, the method comprising:

disposing a film over a surface of a substrate;

removing a plurality of elongated trenches from a negative photoresist to define a plurality of spaced lines comprising the film disposed on the surface of the substrate, each line having a cross- section above the substrate, the cross-section having an outer surface;

disposing a surface tension neutral layer substantially continuous on an entire outer surface of each line, the surface tension neutral layer comprising a neutral group attached to the outer surface of that line via a covalent bond or a hydrogen bond, the surface of the substrate between the lines being substantially free of the surface tension neutral layer; and disposing a block copolymer over the neutral layer of each line and between the lines, the block copolymer having a first block and a second block, wherein the surface tension neutral layer has a first tension sufficiently similar to a second tension of the first block to pin the first block, wherein the block copolymer comprises at least one of poly(ethylene oxide-b-caprolactone), poly(methyl methacrylate-b-t-butyl methacrylate), poly(ethylene oxide-b-propylene oxide), poly(styrene-b-tetrahydrofuran), or poly(styrene-b-isoprene-b-ethylene oxide).

* * * * *